(12) United States Patent
Kanouda et al.

(10) Patent No.: US 8,153,903 B2
(45) Date of Patent: Apr. 10, 2012

(54) CIRCUIT BOARD AND IMAGE DISPLAY APPARATUS

(75) Inventors: Akihiko Kanouda, Hitachinaka (JP); Ryuji Kurihara, Kamakura (JP); Fusao Sakuramori, Yokohama (JP); Takeshi Mochizuki, Yokohama (JP); Yoshihiko Sugawara, Yokohama (JP); Masami Joraku, Tokai (JP)

(73) Assignee: Hitachi, Ltd., Tokyo (JP)

( * ) Notice: Subject to any disclaimer, the term of this patent is extended or adjusted under 35 U.S.C. 154(b) by 673 days.

(21) Appl. No.: 12/328,955

(22) Filed: Dec. 5, 2008

(65) Prior Publication Data

US 2009/0145637 A1    Jun. 11, 2009

(30) Foreign Application Priority Data

Dec. 7, 2007 (JP) .................... 2007-316553

(51) Int. Cl.
*H05K 7/20* (2006.01)
*H05K 7/00* (2006.01)
*H05K 5/00* (2006.01)
*H05K 1/18* (2006.01)
*H05K 1/03* (2006.01)

(52) U.S. Cl. ........ 174/255; 361/717; 361/718; 361/719; 361/720; 361/722; 361/748; 361/758; 361/761

(58) Field of Classification Search .......... 174/250–268; 361/736–812, 717–722
See application file for complete search history.

(56) References Cited

U.S. PATENT DOCUMENTS

2006/0223347 A1* 10/2006 Kim ............................. 439/95

FOREIGN PATENT DOCUMENTS

| JP | 58-66687 U | 5/1983 |
|----|------------|--------|
| JP | 2-42474 U | 3/1990 |
| JP | 3-106791 U | 11/1991 |
| JP | 04-219996 | 8/1992 |
| JP | 6-112621 | 4/1994 |
| JP | 07-038227 | 2/1995 |
| JP | 2004-031495 | 1/2004 |
| KR | 10-2007-0076294 | 7/2007 |

* cited by examiner

*Primary Examiner* — Jayprakash N Gandhi
*Assistant Examiner* — Jerry Wu
(74) *Attorney, Agent, or Firm* — Antonelli, Terry, Stout & Kraus, LLP.

(57) ABSTRACT

In a circuit board disposed in parallel to a fixing plane, a guard spacer (abutting member) is disposed on a multi-layer printed circuit board on the side of the fixing plane to suppress deformation of the multi-layer printed circuit board to prevent short circuit if an impact is applied to the circuit board. The guard spacer may be a dummy electronic component or a plate member. An image display using the circuit board is also disclosed.

10 Claims, 7 Drawing Sheets

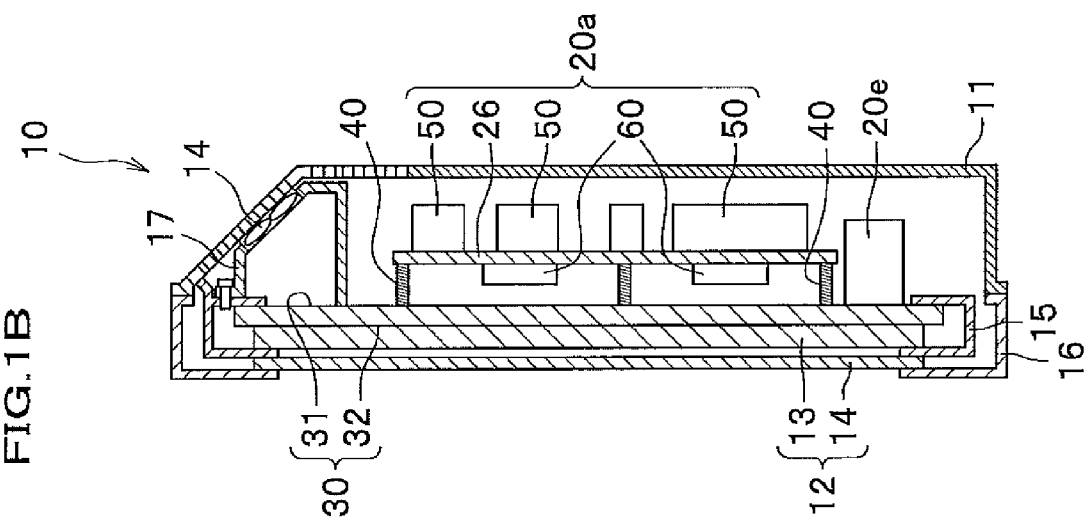
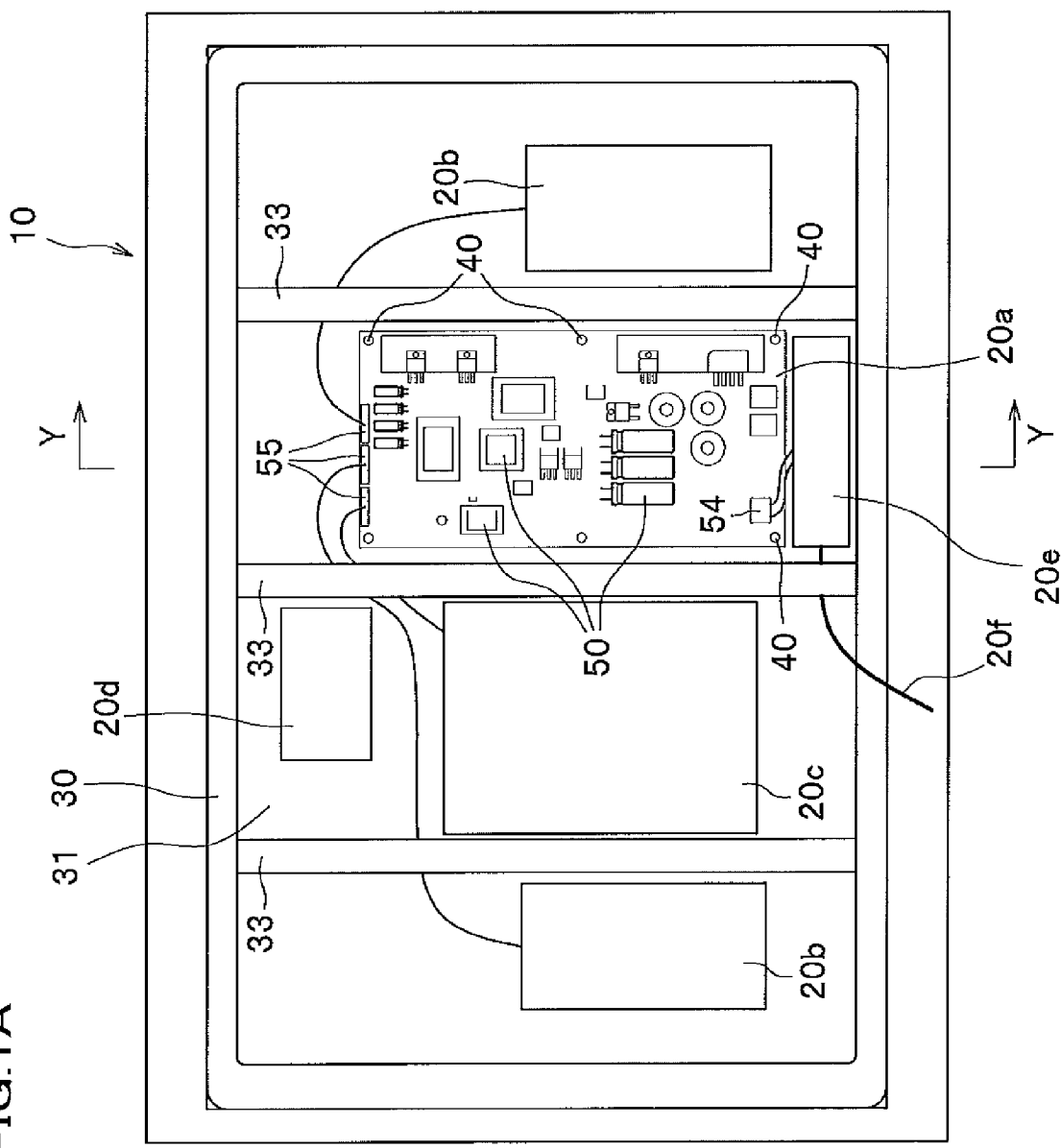

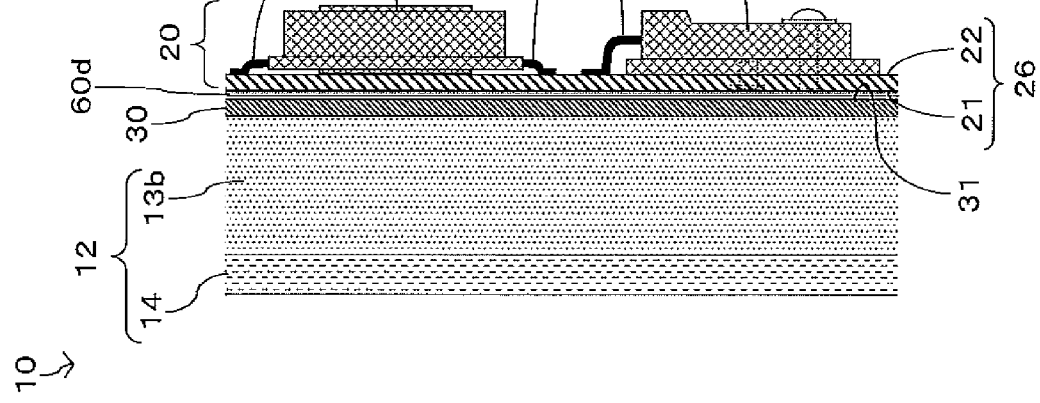
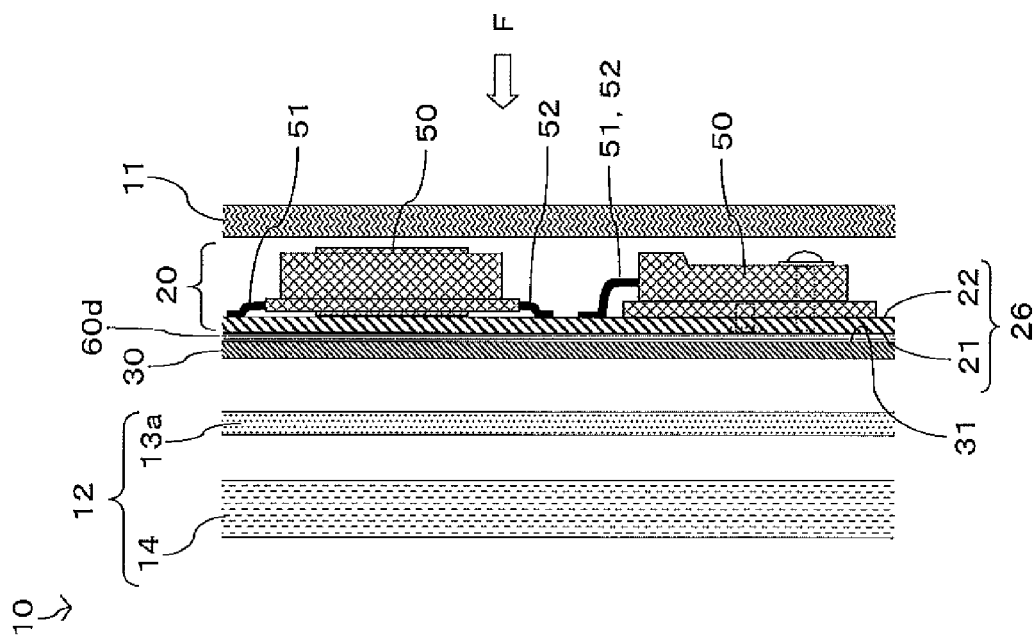

CIRCUIT BOARD AND IMAGE DISPLAY APPARATUS

CROSS REFERENCE TO RELATED APPLICATIONS

This application claims the foreign priority benefit under Title 35, United States Code, §119(a)-(d) of Japanese Patent Application No. 2007-316553, filed on Dec. 7, 2007 in the Japan Patent Office, the disclosure of which is herein incorporated by reference in its entirety.

BACKGROUND OF THE INVENTION

1. Field of the Invention

The present invention relates to a circuit board and an image display apparatus and particularly to a circuit board to be fixed to a fixing plane in parallel and an image display apparatus using the circuit board as a switching power supply board.

2. Description of the Related Art

A flat panel display including a printed circuit board of a switching power supply is known. Further, a technology of protecting a circuit board from short circuit between the circuit board and a fixing plane for the circuit board is known. JP 4-219996 A discloses such a technology that a case has a step part which supports a circuit board and keeps a distance between a fixing plane for the case and the circuit board (see FIG. 1 in JP 4-219996 A).

SUMMARY OF THE INVENTION

A first aspect of the present invention provides a circuit board to be disposed in parallel to a fixing plane through a supporting member, comprises: a multi-layer printed circuit board including a first surface insulation layer facing the fixing plane and a second insulation layer opposite to the first surface insulation layer, an electronic component being mounted on at least one of the first and second insulation layers; and a guard spacer that is disposed on the first insulation layer and electrically insulated from the electronic component.

A second aspect of the present invention provides an image display apparatus comprises: the circuit board based on the first aspect, further comprises a switching power supply circuit board for converting an AC power supplied thereto into a DC power; a back cover supported relative to the fixing plane for enclosing the circuit board therein; and a display body, receiving the DC power, disposed on a rear side of the frame plate, for displaying an image.

BRIEF DESCRIPTION OF THE DRAWINGS

The object and features of the present invention will become more readily apparent from the following detailed description taken in conjunction with the accompanying drawings in which:

FIG. 1A is a cut away view of an image display apparatus according to the present invention in which an inside of the image display apparatus is viewed from a backside thereof;

FIG. 1B is a cross sectional view taken along line Y-Y in FIG. 1A;

FIGS. 6A and 6B are cross sectional views of guard spacers of sixth embodiment.

The same or corresponding elements or parts are designated with like references throughout the drawings.

DETAILED DESCRIPTION OF THE INVENTION

Figure 2A:
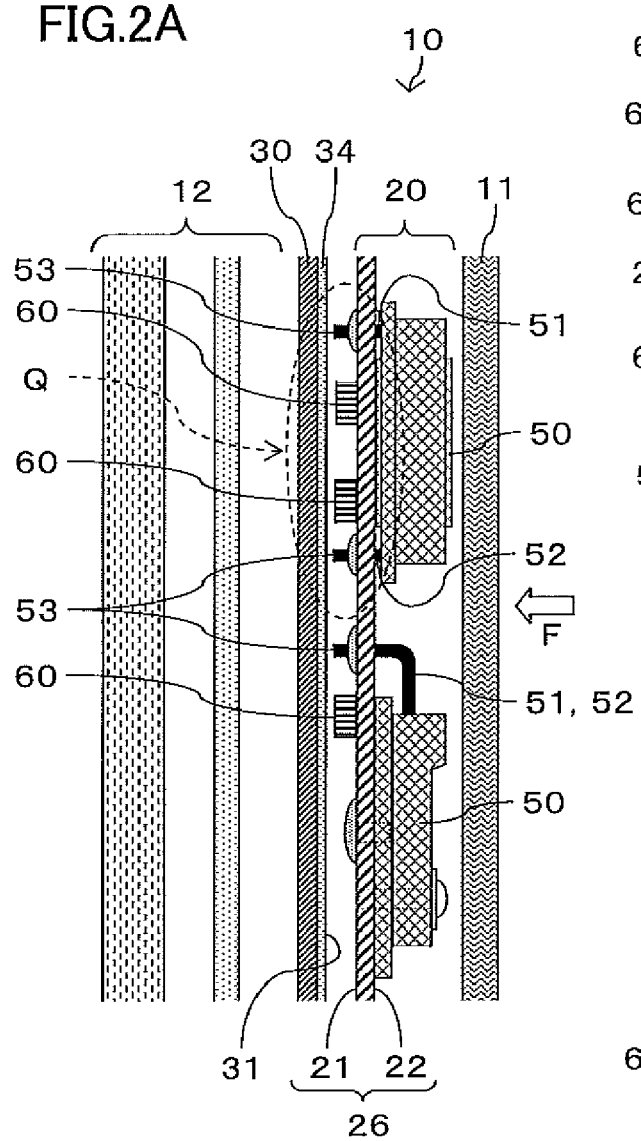
FIG. 2A is a cross sectional view of a part of the image display apparatus according to the present invention.

Prior to describing an embodiment of the present invention, the above-mentioned related art will be further explained.

The prior art flat panel display mentioned above may include a switching power supply circuit board disposed in parallel to a back surface of the flat panel display element thereof. The switching power supply circuit board has a primary circuit with potentials determined by a commercial AC voltage supply and a secondary circuit for generating DC supply voltages with potentials determined by the frame of the flat panel display. The primary circuit is electrically isolated from the secondary circuit in the switching power supply circuit board according to safety standards.

Accordingly it is desirable to provide a sufficient electrical isolation between the secondary circuit and a fixing plane.

To further thin the flat panel display, it is desirable to protect the secondary circuit because the flat panel display may be deformed due to unintentional impact from a back side thereof. The deformation may cause short circuit between the circuit board and the fixing plane.

To avoid this, a gap between the circuit board and the fixing plane may be increased. However, increase in the gap results in increase in thickness of the flat panel display. This is inconsistent with thinning the flat panel display. Further, it is desirable to consider other characteristics of the circuit board such as a cooling performance and a cost performance.

The present invention provides a circuit board to be fixed to a fixing plane of the image display apparatus with a small gap, which is capable of preventing short circuit with the fixing plane although an external force is applied to a back surface of the image display apparatus.

The circuit board secures a distance between the circuit board and the fixing plane with a guard spacer. Since the guard spacer has a sufficient stiffness or compression resistance, the gap between the circuit board and the fixing plane cannot be made thinner than a height of the guard spacer. Further such a guard spacer can be provided at a relatively low cost. Further the guard spacer may secure a space for air convection flows.

The circuit board can prevent electrical breakdown with the fixing plane although the circuit board is fixed with a small gap when the external force is applied from the back side of the image display toward the fixing plane. The circuit board can provide the image display apparatus which is further thinned at a low cost.

With reference to drawings will be described a circuit board and an image display apparatus according to the present invention.

FIG. 1A is a cut away view of an image display apparatus according to the present invention in which an inside of the image display apparatus is viewed from a backside thereof. FIG. 1B is a cross sectional view taken along a line Y-Y in FIG. 1A.

The image display apparatus according to the present invention includes various circuit boards 20 (20a, 20b, 20c, and 20d) supported by a fixing plane 31 of a frame plate 30, a back cover 11 for covering the fixing plane 31 so as to enclose these circuit boards 20.

The image display apparatus further includes a display body 12, supplied with a power from a switching power supply circuit board 20a, disposed on a back surface 32 of the back plate 30 for displaying an image, a first front cover 15 and second front cover 15 for fixing the display body 12 to the frame plate 30, and an exhaust duct 17.

With this structure, all components are fixed to and supported by the frame plate 30 which has a sufficient stiffness to keep a shape of the entire body of the image display apparatus 10. Accordingly other members for securing the sufficient stiffness becomes unnecessary, so that a thickness of the image display apparatus 10 is made thinner.

Heat generated by the components due to the operation of the image display apparatus 10 is carried to the exhaust duct 17 by convention of air flow in gaps between the frame plate 30 and the circuit board 20. The heat is radiated through openings provided on the back cover 11 by a fan 18 (occasionally omitted) provided in the exhaust duct 17 toward the external.

The frame plate 30 comprises an aluminum plate or a steel plate with a thickness from several tenths millimeters to several millimeters with such a sufficient bending stiffness so as to support the whole of the display apparatus 10. On the back surface 32 of the frame plate 30 three supporting pillars 33 are vertically extending in parallel to each other with gaps (spaces) therebetween and the circuit boards 20 (20a, 20b, 20c, and 20d) are disposed in the gaps.

To the frame plate 30 or the pillars 33 a stand (not shown) is connected to put the image display apparatus 10 on a floor or fix the image display apparatus 10 to a wall.

Further on the fixing plane 30 of the frame plate 30 an insulation sheet 34 (see FIG. 2A) is provided to prevent short circuit in case that the circuit board 20 is in contact with the frame plate 30.

The back cover 11 is supported by the frame plate 30 through the first front cover 15 and the second front cover 16. The back cover 11 covers the various components such as the circuit boards 20 (20a, 20b, 20c, 20d, and 20e) and the exhaust duct 17 disposed on the fixing plane 31 of the frame 30.

The back cover 11, the front cover 15, and the second cover 16 are made by injection molding with ABS resin and the like.

The display body 12 includes a backlight module 13 and a liquid crystal display panel (LCD panel) 14.

The backlight module 13 emits light with luminance even over the whole surface of the LCD panel 14.

The LCD panel 14 has a liquid crystal layer and a color filter (not shown) to display an image on a surface thereof by controlling transmission of light.

The present invention is not limited to this structure in which the LCD type of display is used as the display body, but a plasma type or an organic EL (Organic Electro Luminescence type of display) may be used.

As the backlight module 13 a fluorescent lamp 13a (see FIG. 6A) is mainly described hereinafter (see FIG. 6A). However, an edge light type (side light type) of back light module using light emitting diodes (LEDs) and a backlight panel 13b (see FIG. 6B) can be adoptively used.

The circuit board 20 is disposed on the fixing plane 31 of the frame plate 30 in parallel to the fixing plane 31 through supporting members 40. As the circuit board 20, a switching power supply circuit board 20a (also referred to as an AC/DC converter), inverter circuit boards 20b, a logic circuit board 20c, a timing controller circuit board 20d, and a filter circuit board 20e are exemplified.

The present invention is not limited to the circuit boards 20 mentioned above, but can be applied to other circuit boards with a plurality of electronic components 50 on the surface of a circuit board, which cooperatively, electronically operate.

The switching power supply circuit board 20a among these circuits boards receives a commercial voltage supply (AC 100V to AC 240V) via an input terminal 54, converts the commercial voltage supply into DC drive voltages (DC 24 V) and a standby voltage (DC 5.4 V) to be outputted at output terminals 55.

The inverter circuit board 20b receives a DC power (DC 24V) from the output terminal 55 and converts the DC power into an AC voltage (for example 1 to 2 kV) necessary for turning on the fluorescent lamp (not shown) in the backlight module 13. Further, if the LED type of the backlight module is used, the inverter circuit boards 20b are replaced with LED drive circuit boards (not shown).

The logic circuit board 20c includes a on-board type of DC/DC converter on a printed circuit board thereof which receives the DC supply power (DC 24V) supplied from the output terminal 55, converts the DC supply power into a DC voltage (for example, 12V) necessary for the timing controller circuit board 20d or another DC voltage (for example, 13 V) necessary for an audio components such as a speaker, and executes processes for video image and sound signals.

The timing controller circuit board 20d controls elements in the LCD panel 14 on the basis of video signals generated by the logic circuit board 20c.

The filter circuit board 20e includes a low pass filter (LPF) which prevents broad band noise components generated by switching operation of the switching power supply circuit board 20a from leaking to a side of external power supply and has a cable 20f with an AC input plug.

The circuit board 20 is, as shown in FIG. 1B, disposed on the fixing plane 31 in parallel and includes a plurality of electronic components 50 and a plurality of guard spacers (abutting member) 60 having a predetermined height and a predetermined compressive resistance on a surface of a multilayer printed circuit board 26.

The circuit board 20 is configured and disposed as mentioned above, so that a gap between the circuit board 20 and the fixing plane 31 is secured by a height of supporting members 40. Because the guard spacer 60 has sufficient height and compressive resistance, the gap is not made narrower than the height of the guard spacer 60 capable of abutting the fixing plane 31 when an external force F is applied to the circuit board 20 as long as the guard spacer 60 withstands.

Among the electronic components 50 disposed on the switching power supply circuit board 20a are a diode bridge, a power MOSFET (Metal Oxide Field Effect Transistor), booster diodes, a choke coil, a high voltage electrolysis capacitor, a power supply IC module, an insulation transformer, a rectifying diode, a smoother capacitor, a resonation capacitor, a resonation coil, a control IC, and resistors in addition to the input terminal 54 and the output terminal 55.

These electronic components 50 comprise a plurality of terminals (leads) as shown in FIG. 2A showing an enlarged view of a part of FIG. 1B (in FIG. 2A, only the first terminals 51 and the second terminals 52 are shown). The electronic components 50 operate with electrically connection therebetween to provide a predetermined operation of the circuit board 20.

Figure 2B:
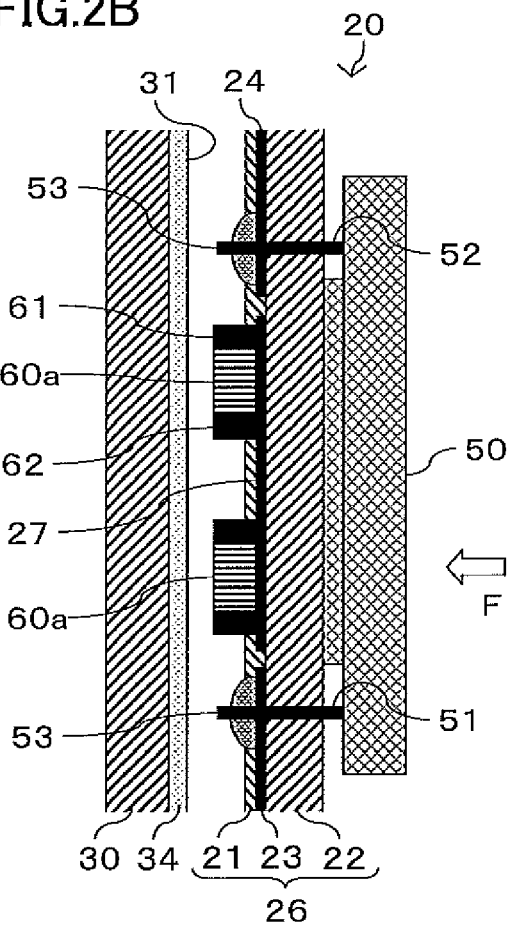
FIG. 2B is an enlarged cross sectional view of a part Q in FIG. 2A for showing the guard spacer of a first embodiment of the present invention.

The multi-layer printed circuit board 26 includes, as shown in FIG. 2B showing a part denoted with "Q" in FIG. 2A with enlargement, a first surface insulation layer 21 facing the fixing plane 31, a second surface insulating layer 22 opposite to the first surface insulation layer 21, a first conducting layer 23 between the first surface insulation layer 21 and the second surface insulation layer 22, a second conducting layer 24 electrically isolated from the first conducting layer 23, an isolated conducting layer 27 electrically isolated from the first conducting layer 23 and the second conducting layer 24. Connected to the first conducting layer 23 is the first terminal 51 and connected to the second conducting layer 24 is the second terminal 52.

Figure 2C:
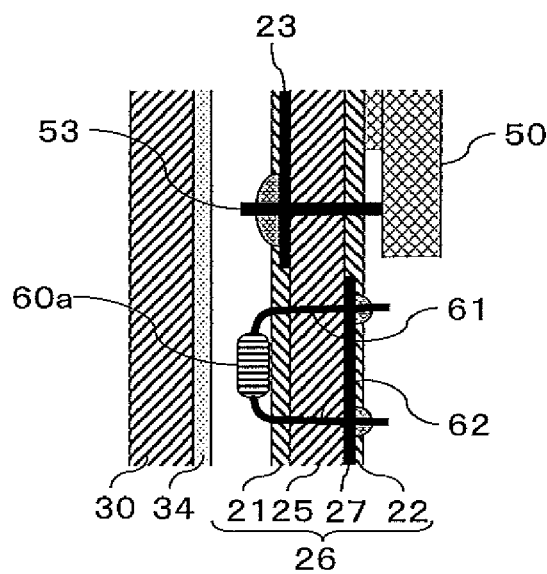
FIG. 2C is an enlarged cross sectional view for showing the guard spacer of a second embodiment of the present invention.

The multi-layer printed circuit board 26 shown in FIG. 1B is only exemplified, and, as shown in FIG. 2C, may be modified such that another insulation layer 25 is provided between the first surface insulation layer 21 and the second insulation layer 22. Further, the first conducting layer 23 (second conducting layer 24) and the insulated conducting layer 27 may be provided in different level layers.

Further, not shown, but in addition to the first conducting layer 23, the second conducting layer 24, and the isolated conducting layer 27, the multi-layer printed circuit board 26 may include a plurality of conducting layers each electrically isolated and connected to terminals other than the first terminal 51 and the second terminal 52.

The multi-layer printed circuit board 26 comprises a substrate with a high stiffness and a thickness of about 1 mm, which is made by impregnating a glass fiber sheet with thermoplastic such as epoxy resin and plating a copper thin film on a surface thereof. Further, a thin type of flexible printed circuit board made by polyimide or the like may be used if a stiffness of the multi-layer printed circuit board 26 it self is unnecessary in such cases of a fifth embodiment (FIG. 5) and a sixth embodiment (FIG. 6) mentioned later.

Protruding parts 53 are parts of the first and second terminals 51 and 52 protruding from the first surface insulation layer 21 after penetrating through holes in the multi-layer printed circuit board 26, which parts are soldered on printed patterns on the multi-layer printed circuit board 26. All of the terminals (the first and second terminals 51 and 52) shown in, for example, FIG. 2A, have the protruding parts 53. However, for example, in a case (not shown) that all of electronic components 50 are mounted on either surface of the multi-layer printed circuit board 26, there are no protruding parts 53.

Figure 2D:
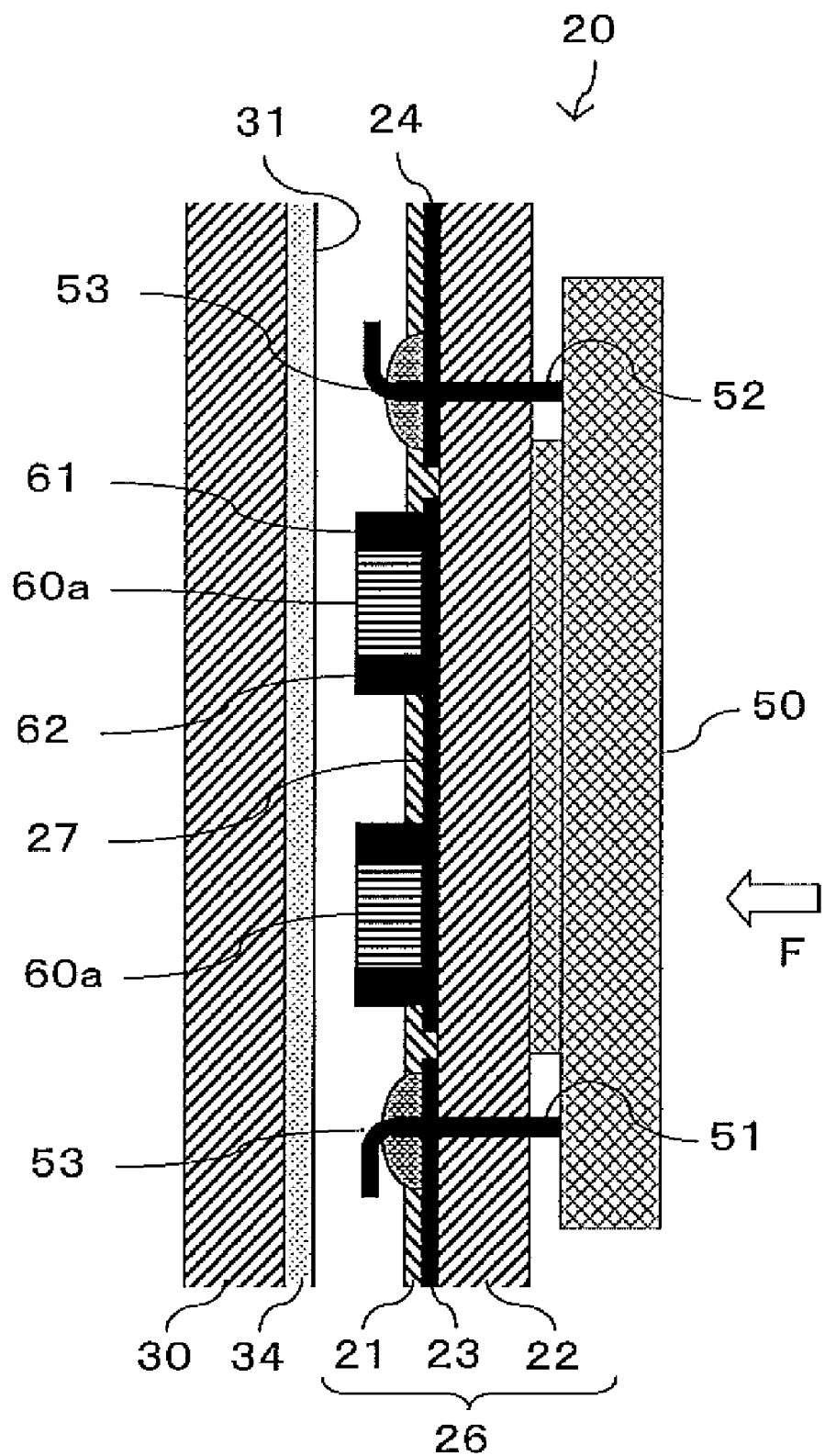
FIG. 2D is a modification of a protruding part shown in FIG. 2C according to the present invention.

Further, in the protruding parts 53 shown in, for example, FIG. 2A, lines along tips of the first and second terminals 51 and 52 intersects the fixing plane 31. However, the lines may be bent such that the lines do not intersect the fixing plane 31 as shown in FIG. 2D.

The protruding parts 53 where the tip of the first and second terminals 51 and 52 are bent to prevent a surface of the insulation sheet 34 from being scratched by contact with the tips of the protruding parts 53 while the multi-layer printed circuit board 26 is bent by some causes.

Further, the tips of the first and second terminals 51 and 52 are oriented to different directions from the fixing plane 31. This prevents electric discharge although a potential difference between the frame plate 30 and the circuit board 20 become large. At the protruding parts 53, the tips of the first and second terminals 51 and 52 are bent as shown in FIG. 2D, which increases an electric insulation characteristic across a gap provided between the multi-layer printed circuit board 26 and the fixing plane 31.

The guard spacer 60 is provided on the first surface insulation layer 21 of the multi-layer printed circuit board 26. The guard spacer 60 has a height which is the same or smaller than a gap between the frame plate 30 and the multi-layer printed circuit board 26 determined by the length of the supporting members 40 and is the same or greater than height of any of the protruding parts 53.

With this structure, if an external force F is applied to the back cover 11, where the back cover 11 is deformed and presses the electronic components 50, causing flexural deformation of the multi-layer printed circuit board 26, the guard spacer 60 abuts the fixing plane 31 which prevents the multi-layer printed circuit board 26 from further being flexibly deformed.

The guard spacer 60 (see FIG. 2A) operating as mentioned above provides advantageous effects as follows:

If an impact is applied to the image display apparatus 10 from a rear side thereof during power on, the guard spacer 60 prevents short circuit between the fixing plane 31 and the circuit board 20 due to contact. If this happens during power off, where the fixing plane 31 contacts the circuit board 20, the guard spacer 60 prevents the electronic components 50 from dropping from the multi-layer printed circuit board 26 due to fatigue caused by a reaction force received by the protruding part 53 from the fixing plane 31.

Further, the guard spacer 60 allows air to pass through the gap between the circuit board 20 and the fixing plane 31 when the circuit board 20 generates heat. Because the guard spacer 60 does not impede the air convection as mentioned above, the circuit board 20 is cooled.

The guard spacer 60 allows the circuit board 20 to be disposed in parallel to the fixing plane 31 of the frame plate 30 with a shorter gap and with a sufficient insulation characteristic against the impact from the external (external force F). This contributes to reducing a thickness of the image display apparatus 10 (see FIG. 1).

First Embodiment

FIG. 2B shows a first embodiment of the guard spacer 60 where a dummy electric component 60a is used which is unrelated to the electronic operation (function) of the circuit board 20. In FIG. 2B, a chip type of resistor is exemplified as the dummy electronic component 60a. However, the first embodiment is not limited to this, but may be modified, and thus lead types of resistor and capacitor, and the like can be used in addition to a chip type of capacitor and an electrical contact.

The guard spacer 60 of the first embodiment (dummy electronic component 60a) has terminals 61 and 62, all of which are connected to an isolated conducting layer 27.

This mounts the dummy electronic component 60a on a rear face of the circuit board 20 (a side of the first surface insulation layer 21). With this structure, in case where the circuit board 20 short-circuits with the frame plate 30 due to contact of the guard spacer 60 with the fixing plane 31 by the external force F, the isolated conducting layer 27 becomes the same voltage potential as the frame plate 30. This does not vary voltage potentials of the conducting layers connected to the electronic components 50 (the first and second conducting layers 23 and 24).

Second Embodiment

FIG. 2C shows a guard spacer 60 (abutting member) of a second embodiment where a dummy electronic component 60a (a lead type of a resistor) is used which is unrelated to the electronic operation (function) of the circuit board 20 like the case shown in FIG. 2B.

The guard spacer 60 (dummy electronic component 60a) of the second embodiment has terminals 62 and 62, all of which are penetrated though through holes in the multi-layer printed circuit board 26 and connected only to the isolation conducting layer 27.

This increases a degree of freedom in the region on which the dummy electronic component 60a is mounted, so that arrangement of the guard spacer 60 is optimized.

Further, although no illustration is shown, all terminals 61 and 62 of the dummy electric component 60a are not connected to any of the conducting layers 23, 24, and 27, but may be adhered to the insulation layers 21, 22, 25 after the terminals 61 and 62 penetrate only through holes in the insulation layers 21, 22, 25.

Although the dummy electronic component 60a is a true electronic part, the dummy electronic component 60a mounted on the circuit board 20 is unrelated to the operation of the circuit board 20 because the dummy electronic component 60a is electrically isolated from the electronic components 50 relating to the operation of the circuit board 20.

Use of the dummy electronic component 60a as the guard spacer 60 improves a cost performance in manufacturing the circuit board 20 or the image display because any special process is unnecessary for providing the guard spacer 60 on the circuit board 20 in a general manufacturing process of the circuit board 20.

Third Embodiment

Figure 3:
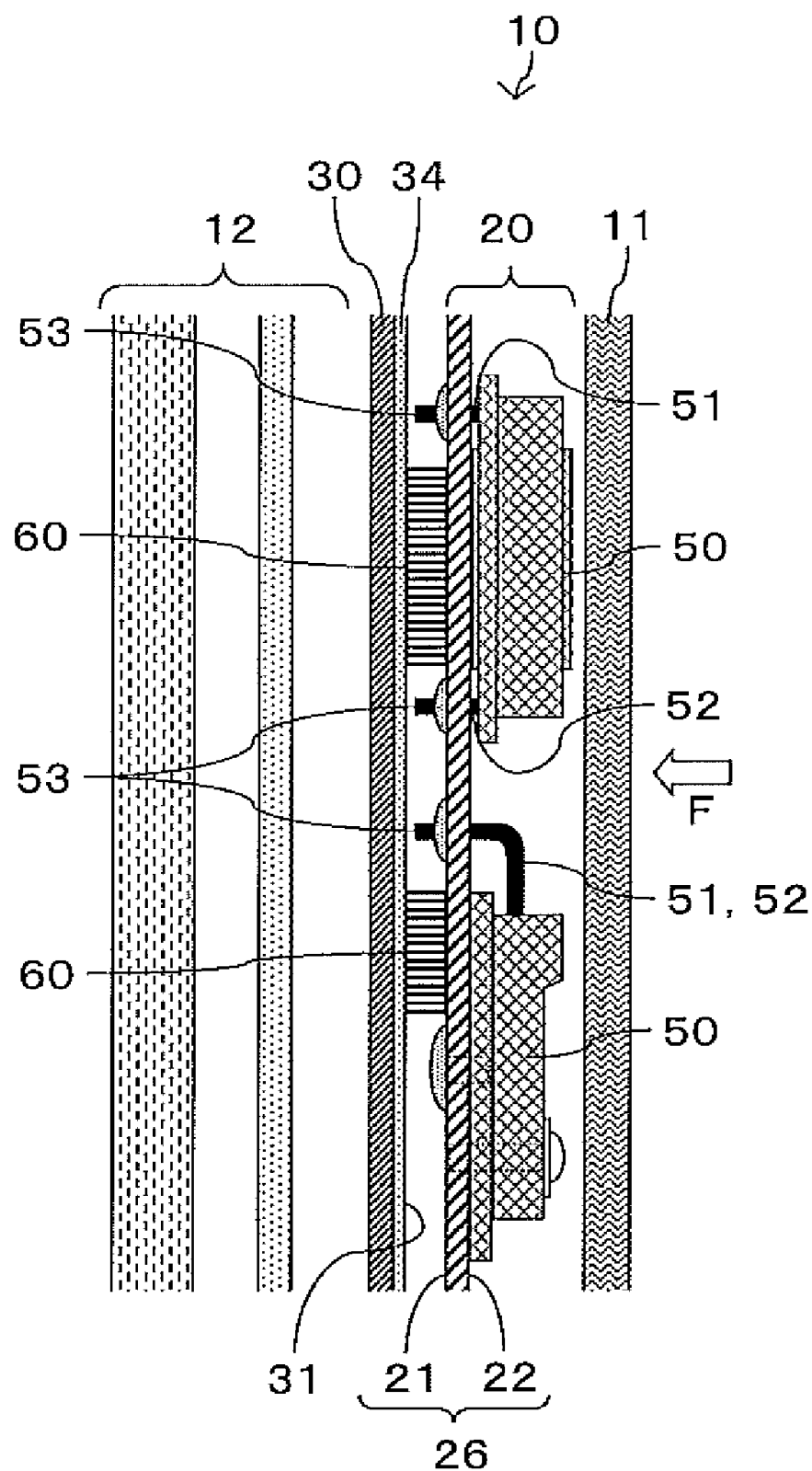
FIG. 3 is an enlarged cross sectional view for showing the guard spacer of a third embodiment of the present invention.

FIG. 3 is an enlarged cross sectional view of a part shown in FIG. 1B to show the guard spacer (abutting member) 60. The guard spacer 60 of the third embodiment is mounted on the multi-layer printed circuit board 26 such that a surface (abutting surface) of the guard spacer opposite to the surface facing the multi-layer printed circuit board 26 is always in contact with the fixing plane 31.

This structure increases a cooling performance for the circuit board 20 generating heat because the guard spacer 60 conducts the heat to carry the heat to the frame plate 30.

To increase the cooling performance by heat conduction, preferably, the guard spacer 60 comprises a material with high heat conductivity and large abutting surface area. However, because such a large abutting area may impede convection of the air passing through the gap between the circuit board 20 and the fixing plane 31, preferably a total balance between the abutting area and the convention of the air is considered.

Fourth Embodiment

Figure 4A:
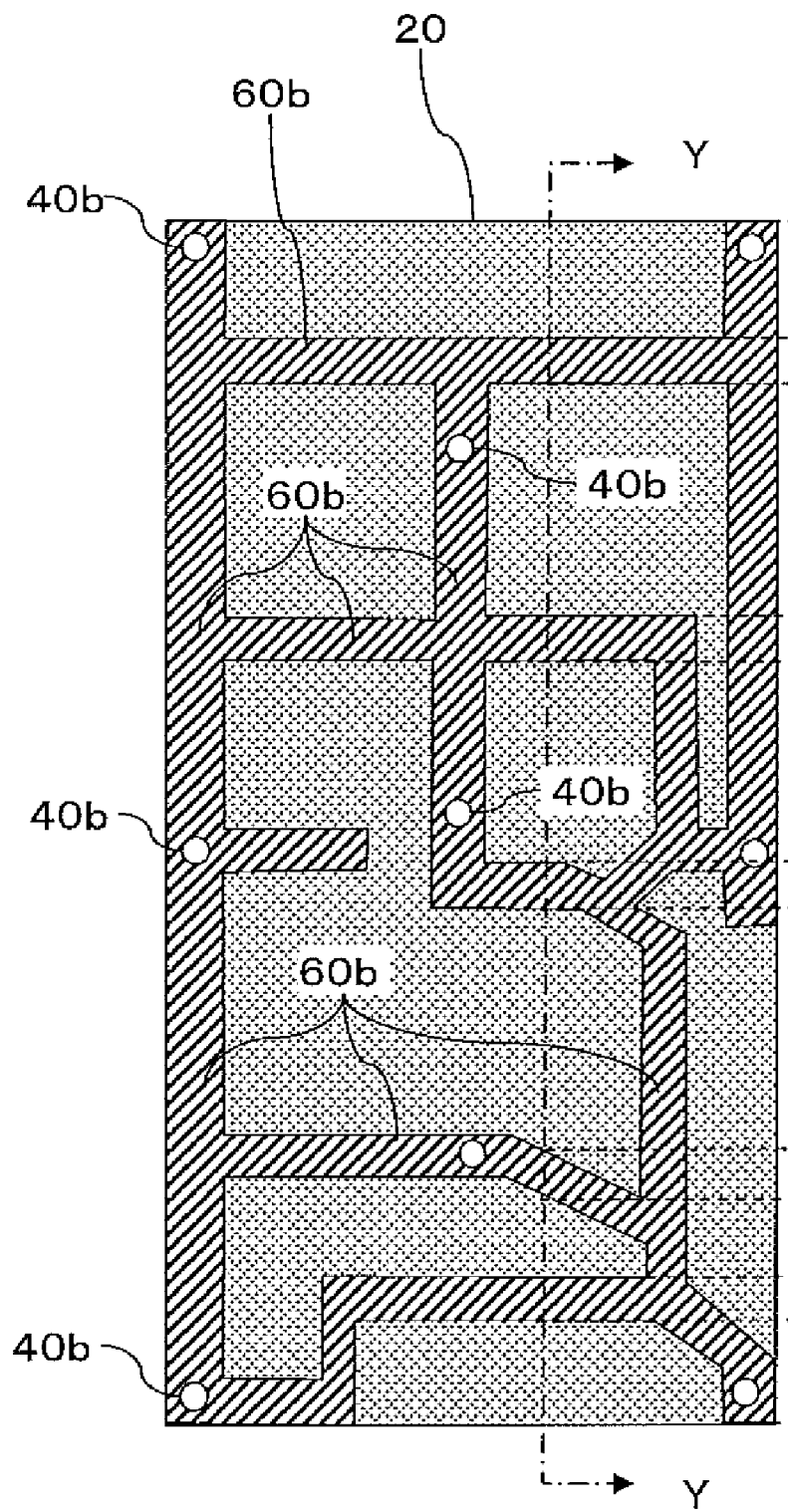
FIG. 4A is a plan view of a rear surface of the circuit board using a guard spacer of a fourth embodiment.
Figure 4B:
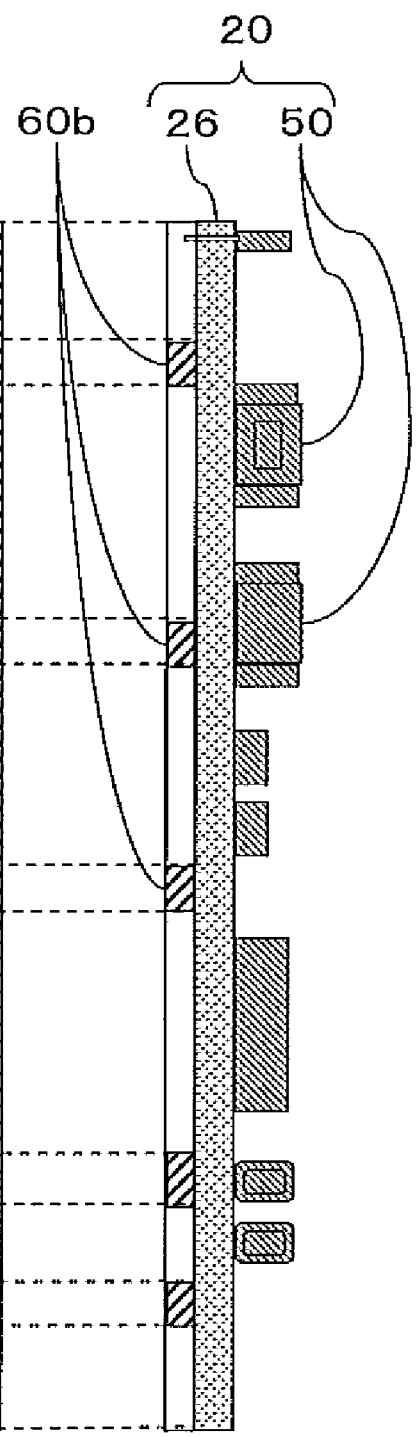
FIG. 4B shows a cross sectional view taken along line Y-Y in FIG. 4A.

FIGS. 4A and 4B show the guard spacer (abutting member) 60 of the fourth embodiment. FIG. 4A shows a rear surface of the circuit board 20 using the guard spacer 60b of the fourth embodiment, and FIG. 4B shows a cross sectional view taken along line Y-Y in FIG. 4A. The guard spacer 60b of the fourth embodiment is formed integrally with the supporting member 40 (40b) as well as determine a distance between the fixing plane 31 and the circuit board 20 such that the guard spacer 60 is always in contact with the fixing plane 31 (see FIG. 1).

The guard spacer 60b is configured as mentioned above, so that the number of parts of the circuit board 20 is reduced, which increases a cost performance in manufacturing the circuit board 20. Further, forming the guard spacer 60b integrally with the supporting members 40 results in increase in contact area of the guard spacer 60b with the fixing plane 31, which increases the cooling performance for the circuit board 20 because a heat conductivity via the guard spacer 60b is increased. On the other hand, the cooling performance by the convection of the air passing through the gap is reduced.

Fifth Embodiment

Figure 5:
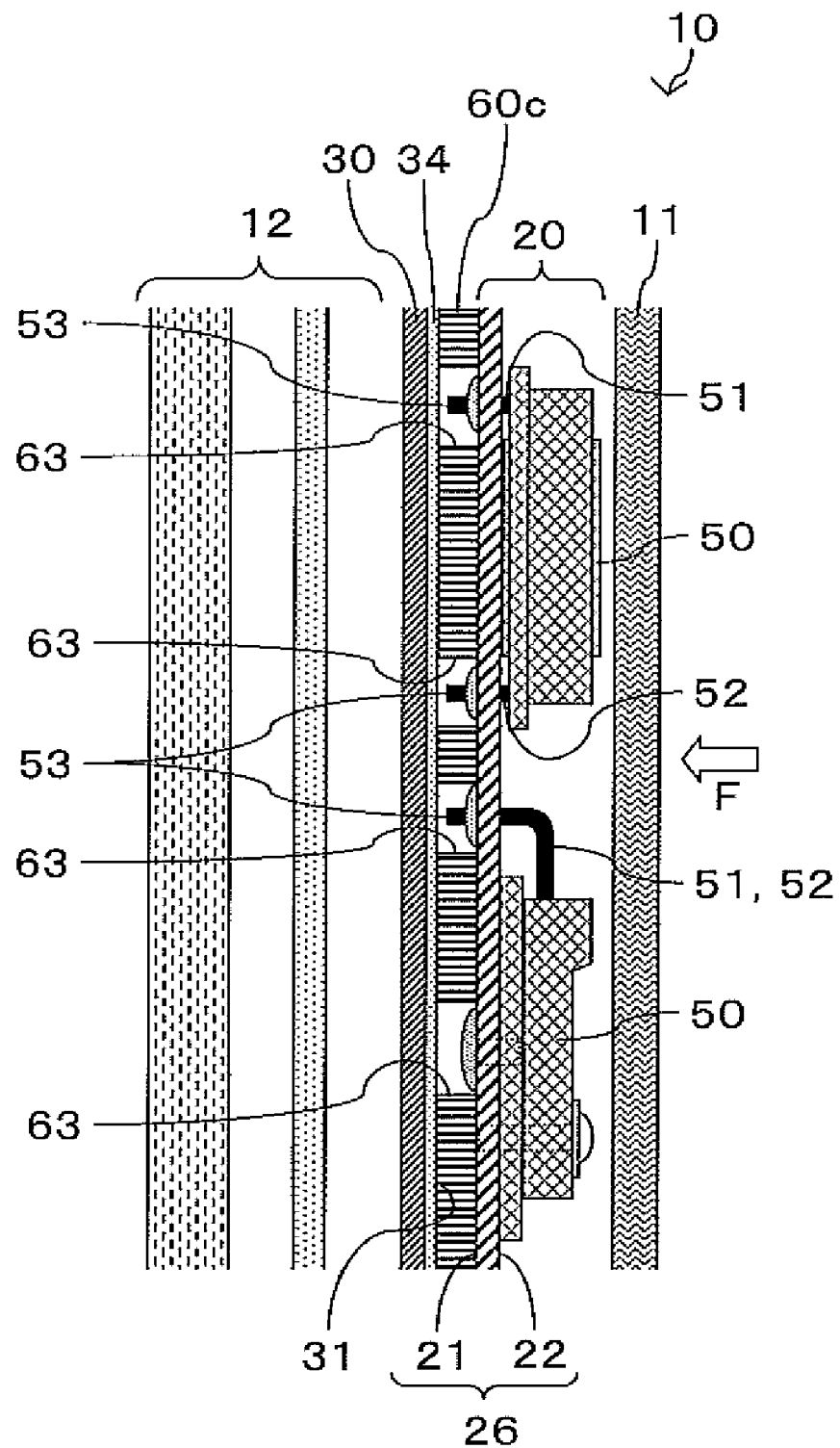
FIG. 5 is a cross sectional view showing a guard spacer of a fifth embodiment.

FIG. 5 shows a guard spacer (abutting member) 60 of a fifth embodiment. The guard spacer of the fifth embodiment comprises a plate member 60c adhered to a surface of the multi-layer printed circuit board 26 on the side of the frame plate 30.

The plate member 60c has through holes 63 at which the protruding parts 53 interferes with the plate member 60c.

The guard spacer 60 (plate member 60c), configured as mentioned above, increases the cost performance, because the number of manufacturing processes decreases. Further, this structure increases a contact area with the fixing plane 31, which increases the cooling performance of the circuit board 20 by heat conduction to the frame plate 30.

Further, tight contact of the plate member 60c with almost the entire surface of the circuit board 20 prevents the circuit board 20 from being bent even if a thickness of the multi-layer printed circuit board 26 is smaller, which contributes thinning image display apparatus.

The above-mentioned description has been made with assumption that the circuit board 20 has the protruding parts 53 at the multi-layer printed circuit board 26. However, even if all electronic components 50 are mounted only on either surface of the multi-layer printed circuit board 26 without the protruding parts 53, the present invention is applicable to such a case as long as the multi-layer printed circuit board 26 is fixed to the fixing plane 31 through the supporting members 40.

Sixth Embodiment

FIGS. 6A and 6B show partial cross sectional views of the image display apparatus.

The same references as those described in the first to fifth embodiment are designated with the same or like references, and thus a duplicated description will be omitted.

The structure shown in FIG. 6A eliminates the necessity of the supporting members 40 (see FIG. 1B).

FIG. 6A shows a case where a fluorescent lamp 13a is employed as a light source for the display body 12. FIG. 6B shows a case where the edge light method is used in which light is guided from both sides of a light guide plate 13.

The guard spacer (abutting member) 60 of the sixth embodiment corresponds to an insulation sheet 60d for electrically insulate the circuit board 20 from the flame plate 30. In this structure, the insulation sheet 60d can function as the guard spacer 60 only in a case in which there is no protruding parts 53 (see FIG. 2A) although all electronic parts 50 are mounted.

The guard spacer 60 (the insulation sheet 60d), configured as mentioned above, further increases the contact area with the fixing plane 31. This further increases the cooling performance for the circuit board 20 by the heat conduction to the frame plate 30.

Further, this structure eliminates the necessity of the gap between the frame plate 30 and the circuit board 20, which contributes thinning the image display apparatus 10 (see FIG. 1).

The invention claimed is:
1. An image display apparatus comprising:
a frame plate having a fixing plane;

a multi-layer printed circuit board supported by the frame plate through a supporting member and disposed in parallel to the fixing plane, the circuit board including a first surface insulation layer facing the fixing plane and a second insulation layer opposite to the first surface insulation layer, an electronic component being mounted on at least one of the first and second insulation layers, the circuit board comprising a switching power supply circuit board for converting an AC power supplied thereto into a DC power;

a back cover supported by the frame plate for enclosing the circuit board therein;

a display body, receiving the DC power, disposed on a rear side of the frame plate, displaying an image, and wherein the electronic component includes a terminal that penetrates through holes in the multi-layer printed circuit board and protrudes from the first surface insulation layer as a protruding part; and a guard spacer on the first surface insulation layer and electrically insulated from the electric component, comprising a dummy electronic component that is unrelated to an operation of the circuit board;

wherein the guard spacer has a predetermined height that is the same as or greater than a height of the protruding part in a thickness direction of the multi-layer printed circuit board and smaller than a gap between the fixing plane and the printed circuit board, defined by the supporting member; and wherein a heat generated by the electronic component is transmitted to the frame plate by convection.

2. The circuit board as claimed in claim 1, wherein the multi-layer printed circuit board comprises a conducting layer connected to the terminal of the electronic component and an isolation conducting layer, electrically isolated from the conducting layer, connected to a terminal of the dummy electronic component.

3. The circuit board as claimed in claim 1, wherein the guard spacer and the supporting member are integrally formed.

4. The circuit board as claimed in claim 3, wherein the guard spacer comprises a plate member, adhered to the first insulation layer, including a through hole where the protruding part interferes with the guard spacer.

5. The circuit board as claimed in claim 1, wherein a tip of the terminal includes a bent part as the protruding part.

6. An image display apparatus comprising:
a frame plate having a fixing plane;
a multi-layer printed circuit board supported by the frame plate through a supporting member, and disposed in parallel to the fixing plane, the multi-layer printed circuit board including:
  a first surface insulation layer facing the fixing plane,
  a second insulation layer opposite to the first surface insulation layer,
  an electronic component mounted on at least one of the first and second insulation layers, including a terminal configured to penetrate through one or more holes in the multi-layer printed circuit board and protrude from the first surface insulation layer as a protruding part, wherein heat generated by the electronic component is transmitted by convection to the frame plate, and
  a switching power supply circuit board configured to convert an AC power supplied thereto into a DC power;
a back cover, supported by the frame plate, configured to enclose the multi-layer printed circuit board therein;
a display body, configured to receive DC power, disposed on a rear side of the frame plate, and configured to display an image; and
a guard spacer disposed on the first surface insulation layer and electrically insulated from the electric component, the guard spacer including a dummy electronic component unrelated to an operation of the circuit board, and the guard spacer having a predetermined height equal to or greater than a height of the protruding part in a thickness direction of the multi-layer printed circuit board, and smaller than a gap between the fixing plane and the printed circuit board as defined by the supporting member.

7. The circuit board as claimed in claim 6, wherein a tip of the terminal includes a bent part as the protruding part.

8. The circuit board as claimed in claim 6, wherein the multi-layer printed circuit board comprises a conducting layer connected to the terminal of the electronic component and an isolation conducting layer, electrically isolated from the conducting layer, connected to a terminal of the dummy electronic component.

9. The circuit board as claimed in claim 6, wherein the guard spacer and the supporting member are integrally formed.

10. The circuit board as claimed in claim 9, wherein the guard spacer comprises a plate member, adhered to the first insulation layer, including a through hole where the protruding part interferes with the guard spacer.

* * * * *